United States Patent
Li et al.

(10) Patent No.: US 12,416,660 B1
(45) Date of Patent: Sep. 16, 2025

(54) SYSTEM AND METHOD FOR BREAKAGE EARLY WARNING OF HIGH-VOLTAGE TRANSMISSION LINES BASED ON ACOUSTIC PRINTS

(71) Applicant: Zhejiang University of Science and Technology, Hangzhou (CN)

(72) Inventors: Guanglei Li, Hangzhou (CN); Yuanyuan Chen, Hangzhou (CN); Shuguang Li, Hangzhou (CN); Zhangrui Zheng, Hangzhou (CN); Chongguang Weng, Hangzhou (CN); Chao Shen, Hangzhou (CN)

(73) Assignee: Zhejiang University of Science and Technology, Hangzhou (CN)

( * ) Notice: Subject to any disclaimer, the term of this patent is extended or adjusted under 35 U.S.C. 154(b) by 0 days.

(21) Appl. No.: 19/215,754

(22) Filed: May 22, 2025

(30) Foreign Application Priority Data

May 16, 2025 (CN) .......................... 202510633147.2

(51) Int. Cl.
| | |
|---|---|
| *G01R 31/08* | (2020.01) |
| *G05B 13/04* | (2006.01) |
| *G05B 15/02* | (2006.01) |
| *G08B 21/10* | (2006.01) |
| *G08B 31/00* | (2006.01) |

(52) U.S. Cl.
CPC .......... *G01R 31/088* (2013.01); *G01R 31/085* (2013.01); *G05B 13/048* (2013.01); *G08B 21/10* (2013.01); *G08B 31/00* (2013.01); *G05B 15/02* (2013.01)

(58) Field of Classification Search
CPC ...... G01R 31/085; G08B 21/10; G08B 31/00; G05B 15/02
USPC .......................................................... 700/292
See application file for complete search history.

(56) References Cited

U.S. PATENT DOCUMENTS

| | | | |
|---|---|---|---|
| 6,917,888 B2 * | 7/2005 | Logvinov | H02J 13/00002 702/59 |
| 10,938,314 B2 * | 3/2021 | Inam | H02M 5/458 |
| 12,332,293 B2 * | 6/2025 | Iyer | H02J 13/00006 |

(Continued)

FOREIGN PATENT DOCUMENTS

| | | | | |
|---|---|---|---|---|
| CN | 114298175 A | | 4/2022 | |
| CN | 115061009 A | * | 9/2022 | G08B 7/06 |

(Continued)

*Primary Examiner* — Ronald D Hartman, Jr.

(57) ABSTRACT

A system for breakage early warning of high-voltage transmission lines based on acoustic prints, including a data acquisition unit, an edge processing unit, a cloud server, a warning execution unit, and a communication unit. The data acquisition unit is configured to collect environmental information of a high-voltage transmission tower in real time through a multimodal sensing device. The edge processing unit includes an adaptive filtering module configured to eliminate wind noise interference in the environmental information and compensate for frequency response deviation. The cloud server can generate a warning instruction based on the environmental information. The warning execution unit can perform warning and alarming actions based on the warning instruction. The communication unit is configured to enable data and information transmission among the units. A method implemented by such system is also provided.

10 Claims, 4 Drawing Sheets

(56) References Cited

U.S. PATENT DOCUMENTS

2024/0085468 A1* 3/2024 Sepulveda Leon ... H02J 50/001
2025/0070594 A1* 2/2025 Zhang ................... H02J 3/0012

FOREIGN PATENT DOCUMENTS

| CN | 115190270 A | * | 10/2022 | ............ | G08B 25/10 |
| CN | 111404274 B | | 6/2023 | | |
| CN | 116976111 A | | 10/2023 | | |
| CN | 114731038 B | * | 4/2025 | ............ | H02H 7/226 |

* cited by examiner

SYSTEM AND METHOD FOR BREAKAGE EARLY WARNING OF HIGH-VOLTAGE TRANSMISSION LINES BASED ON ACOUSTIC PRINTS

CROSS-REFERENCE TO RELATED APPLICATIONS

This application claims the benefit of priority from Chinese Patent Application No. 202510633147.2, filed on May 16, 2025. The content of the aforementioned application, including any intervening amendments thereto, is incorporated herein by reference in its entirety.

TECHNICAL FIELD

This application relates to high-voltage power transmission, and more particularly to a system and method for breakage early warning of high-voltage transmission lines based on acoustic prints.

BACKGROUND

The current transmitted between high-voltage transmission towers typically reaches the level of hundreds of kilovolts. Since the power transmission lines heavily rely on the physical integrity of inter-tower conductors, any external damage (such as collisions by construction vehicles and improper crane operations) may lead to breakage, short circuits, or arc discharges, resulting in severe consequences including personal injuries and power outage of the main grid. Currently, the protection and monitoring of the transmission lines primarily relies on manual inspection, video surveillance, vibration sensors, drone inspection, and multispectral remote sensing. However, these methods are often performed independently, and there is a lack of multi-dimensional data collaborative analysis. In the practical applications, the limitations of a single-sensor system often cause delayed warnings and insufficient localization accuracy. To address these issues, the present disclosure provides a system and method for breakage early warning of high-voltage transmission lines.

SUMMARY

An object of the present disclosure is to provide a system and method for breakage early warning of transmission lines based on acoustic prints to remedy the deficiencies in the prior art.

Technical solutions of the present disclosure are described as follows.

In a first aspect, this application provides a method for breakage early warning of a transmission line based on acoustic prints, comprising:

collecting, by a data acquisition unit, environmental information of each of a plurality of transmission towers; and transmitting, via a communication network, the environmental information to an edge processing unit;

processing, by the edge processing unit, the environmental information to generate an encrypted data packet comprising a coordinate of a detection device provided at a base of each of the plurality of transmission towers, a risk level and a three-dimensional spectral snapshot; and transmitting, via the communication network, the encrypted data packet to a feedback reinforcement module and a cloud server;

parsing and computing, by the cloud server, the encrypted data packet to generate a warning instruction and a three-dimensional situation simulation map; and transmitting, via the communication network, the warning instruction to a warning execution unit; and executing, by the warning execution unit, a warning strategy corresponding to a level of the warning instruction.

In some embodiments, wherein the step of collecting the environmental information of the transmission tower by the data acquisition unit further comprises:

deploying at least one multimodal sensing device at a base of each of the plurality of transmission towers to collect acoustic print information, a location coordinate of a construction vehicle operating under the plurality of transmission towers and meteorological monitoring data in real time.

In some embodiments, the step of processing, by the edge processing unit, the environmental information further comprises:

processing, by an adaptive filtering module within the edge processing unit, the acoustic print information to eliminate wind noise interference and compensate for a frequency response deviation of the at least one multimodal sensing device;

extracting, by a processing chip within the edge processing unit, a mel-frequency cepstral coefficient (MFCC) feature from the acoustic print information and low-frequency spectral energy entropy generated by a vibration signal of the construction vehicle followed by comparison to form a multimodal feature;

inputting the multimodal feature into an artificial intelligence (AI) model to complete acoustic-vibration feature matching within 20 ms and output a confidence score;

for an abnormal event with the confidence score exceeding a predefined threshold, triggering a Kalman filter-based baseline correction algorithm to eliminate an effect of temperature drift; and compressing a key feature vector using Lempel-Ziv 4 (LZ4) followed by embedding with a spatiotemporal tag to generate the encrypted data packet comprising the device coordinate, a refined feature flow, a BeiDou positioning coordinate, the meteorological monitoring data, and the three-dimensional spectral snapshot.

In some embodiments, the step of parsing and computing, by the cloud server, the encrypted data packet further comprises:

accessing, in real time, the encrypted data packet uploaded by the edge processing unit through a multi-source data fusion engine based on a Kubernetes-orchestrated distributed computing cluster;

modeling a three-dimensional spatial topology relationship of the plurality of transmission towers by using a Graph Spatio-Temporal Attention Network (GSTAN), and performing millimeter-level three-dimensional positioning of construction machinery through an improved Iterative Closest Point (ICP) point cloud registration algorithm; and initiating a multi-dimensional safety distance assessment, and triggering a multimodal dwell-time monitoring mechanism in response to a case that a construction vehicle is sensed to enter an electronic fence warning zone.

In some embodiments, the step of triggering the multimodal dwell-time monitoring mechanism comprises:

parsing, in real time, the MFCC feature from the acoustic print information and thermal imaging data through Spark Streaming; and if a duration when the construction vehicle stays in a hazardous zone exceeds a predefined threshold, invoking a federated learning-optimized risk assessment model; and performing multi-factor weighted decision-making based on a historical health status of the construction vehicle, ambient temperature and humidity, and a real-time spectral feature to generate the warning instruction and the three-dimensional situation simulation map.

In some embodiments, the step of executing, by the warning execution unit, the warning strategy corresponding to the level of the warning instruction comprises:

if the warning instruction is a level-1 warning instruction, activating a local acoustic-visual alarm device of the plurality of transmission towers; and triggering, via the communication network, a BeiDou positioning module on each of the plurality of transmission towers to transmit a voice alert to an operation cabin of the construction vehicle located within a 300-meter radius of each of the plurality of transmission towers.

In some embodiments, the step of executing, by the warning execution unit, the warning strategy corresponding to the level of the warning instruction comprises:

if the warning instruction is a level-2 warning instruction, initiating a remote collaborative response, and automatically dispatching, via the communication network, an electronic work order to inspection personnel, wherein the electronic work order comprises a three-dimensional positioning coordinate, a risk heat map and a response plan; and dispatching an unmanned aerial vehicle (UAV) formation to a construction vehicle operation site to perform aerial evidence collection using an onboard infrared thermal imager and to send a remote alarm through a loudspeaker system.

In some embodiments, the step of executing, by the warning execution unit, the warning strategy corresponding to the level of the warning instruction comprises:

if the warning instruction is a level-3 warning instruction, establishing a coordinated interaction with a power grid control system, and transmitting a line voltage reduction command to a dispatch master station via an OPC Unified Architecture (OPCUA) protocol;

marking a risk segment on a digital twin platform;

transmitting data by a UAV to a control unit of the power grid control system in real time;

optimizing a feature extraction threshold of the AI model via a federated learning mechanism; and entirely recording a warning event using a blockchain technology.

In a second aspect, this application provides a system for implementing the above method, comprising:

the data acquisition unit;
the edge processing unit;
the cloud server;
the warning execution unit; and
a communication unit;

wherein the data acquisition unit comprises the at least one multimodal sensing device; and the data acquisition unit is configured to collect the environmental information of the plurality of transmission towers in real time through the at least one multimodal sensing device;

the edge processing unit comprises the adaptive filtering module and the processing chip; the adaptive filtering module is configured to eliminate the wind noise interference in the environmental information collected by the at least one multimodal sensing device and compensate for the frequency response deviation; and the processing chip is configured to extract the MFCC feature from the acoustic print information and the low-frequency spectral energy entropy from the vibration signal;

the cloud server is configured to generate the warning instruction based on the environmental information processed by the edge processing unit;

the warning execution unit is configured to perform warning and alarming actions based on the warning instruction generated by the cloud server; and the communication unit is configured to enable data and information transmission among the data acquisition unit, the edge processing unit, the cloud server and the warning execution unit.

In some embodiments, each of the at least one multimodal sensing device comprises a acoustic print sensor array, a fiber-optic acoustic sensor, a vibration sensor, an infrared thermal imaging module and a positioning module; and the data acquisition unit is internally equipped with an adaptive gain circuit and an anti-aliasing filter.

Compared to the prior art, the present disclosure has the following beneficial effects.

By means of the data acquisition unit, acoustic print information and the device coordinate around the plurality of transmission towers are collected in real time, and then rapidly analyzed and evaluated in coordination by the edge processing unit and the cloud server. When it is determined that a large construction vehicle is operating and dwelling within a safety distance of the plurality of transmission towers, the warning execution unit immediately performs the warning and alarming actions. Then, relevant information is fed back to the data acquisition unit, forming a closed loop to ensure real-time monitoring of the surroundings of the transmission towers, thereby enabling timely warning and alarming of nearby vehicles.

BRIEF DESCRIPTION OF THE DRAWINGS

In order to illustrate the technical solutions in the embodiments of the present disclosure or the prior art more clearly, the accompanying drawings needed in the description of the embodiments or prior art will be briefly described below. Obviously, presented in the accompanying drawings are only some embodiments of the present disclosure, and for those of ordinary skill in the art, other accompanying drawings can be obtained from the structures illustrated therein without making creative effort.

In the figures: 201—multimodal sensing device and 202—high-voltage transmission tower.

The implementation, functional characteristics, and advantages of the present disclosure will be further described in conjunction with the embodiments and the accompanying drawings.

DETAILED DESCRIPTION OF EMBODIMENTS

The technical solutions of the present disclosure will be described clearly and completely below in conjunction with the accompanying drawings. It is obvious that described herein are merely some embodiments of the present disclosure, rather than all embodiments of the present disclosure. Based on the embodiments in the present disclosure, all other embodiments obtained by those of ordinary skill in the art without making creative effort shall fall within the scope of the present disclosure defined by the appended claims.

It should be noted that all directional indications (such as up, down, left, right, front, and back) in the embodiments of the present disclosure are used only for explaining the relative positional relationship or movement between the components in a particular attitude (as shown in the accompanying drawings), and the directional indications are correspondingly changed if the particular attitude is changed.

Furthermore, as used herein, terms such as "first" and "second" are only descriptive, and should not be construed as indicating or implying their relative importance or implicitly specifying the number of technical features indicated. As a result, a feature defined as "first" or "second" may include at least one of such feature, either explicitly or implicitly. In addition, "and/or" includes three solutions, for example, "A and/or B" includes technical solution A, technical solution B, and a combination thereof. In addition, the technical solutions of various embodiments may be combined with each other on the premise that the combined solution can be implemented by those of ordinary skill in the art. When the combination of technical solutions appears to be contradictory or unimplementable, it should be understood that such a combination does not exist, and is not included within the scope of the present disclosure.

Figure 1:
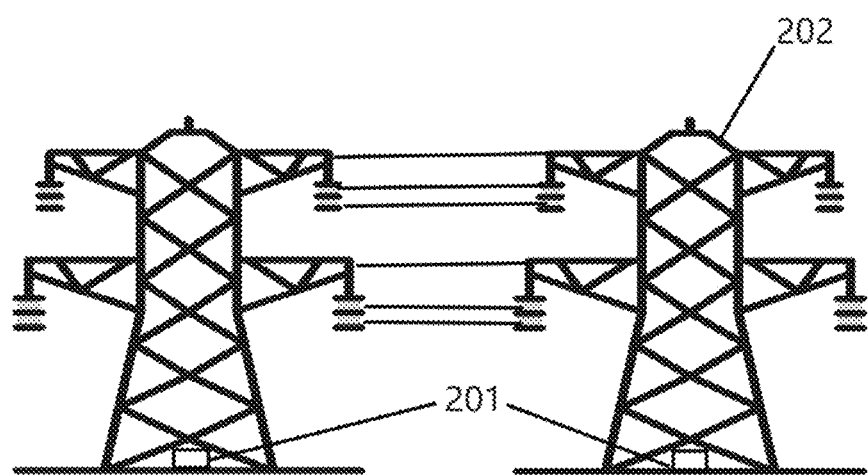
FIG. 1 schematically shows an installation position of a system for breakage early warning of a high-voltage transmission line according to an embodiment of the present disclosure.
Figure 2:
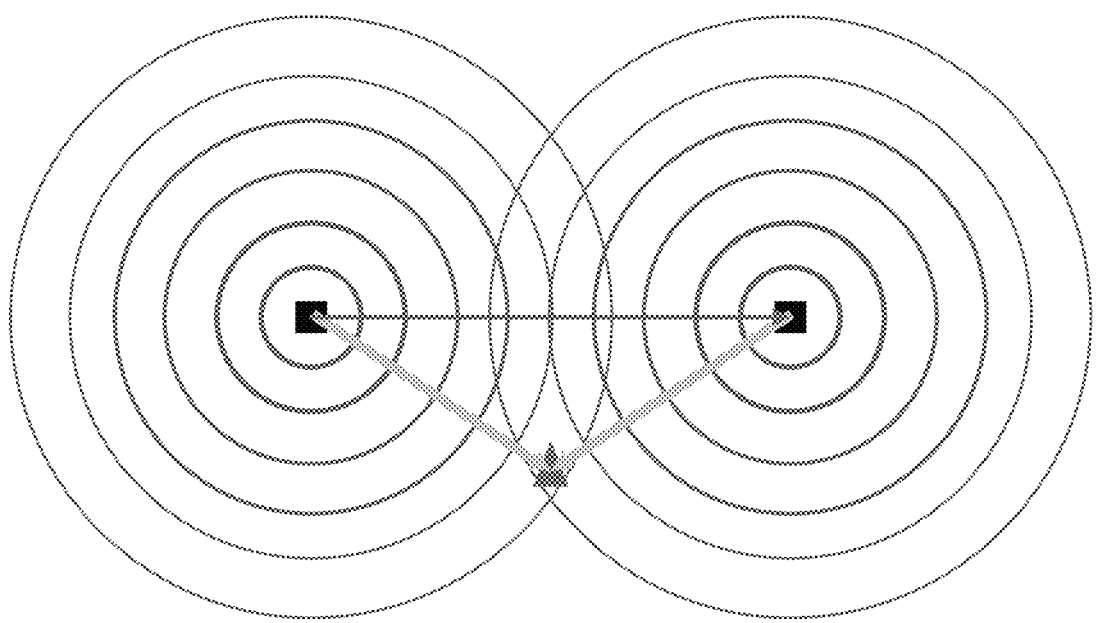
FIG. 2 schematically shows a coverage area of the system according to an embodiment of the present disclosure.
Figure 3:
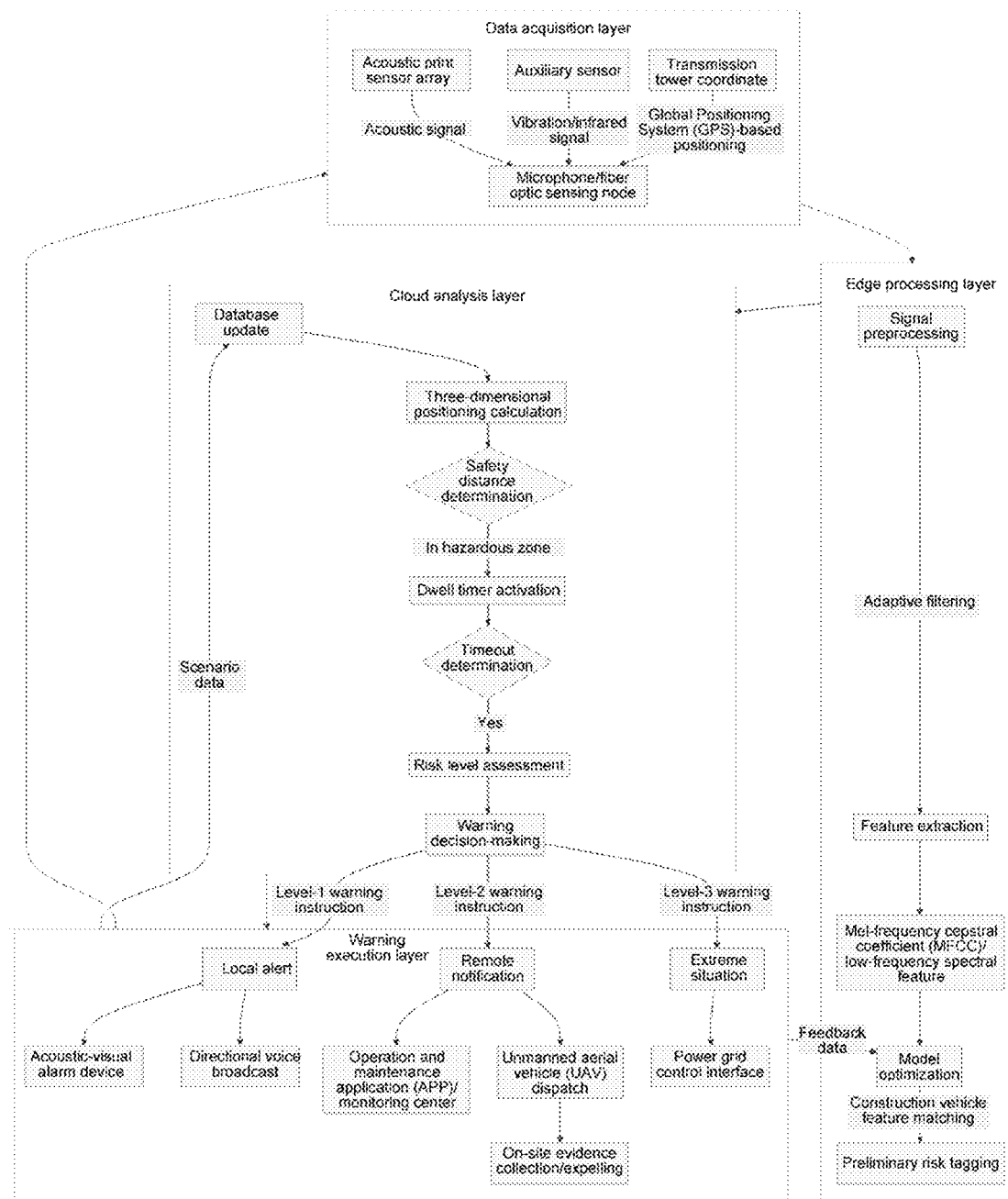
FIG. 3 is a structural diagram of the system according to an embodiment of the present disclosure.

As shown in FIGS. 1-3, an embodiment of the present disclosure provides a system for breakage early warning of a high-voltage transmission line, including a data acquisition unit, an edge processing unit, a cloud server, a warning execution unit and a communication unit. The data acquisition unit includes at least one multimodal sensing device. The data acquisition unit is configured to collect environmental information of a plurality of transmission towers in real time through the at least one multimodal sensing device. The edge processing unit includes an adaptive filtering module and a processing chip. The adaptive filtering module is configured to eliminate wind noise interference in the environmental information collected by the at least one multimodal sensing device and compensate for a frequency response deviation. The processing chip is configured to extract an mel-frequency cepstral coefficient (MFCC) feature from acoustic print information and low-frequency spectral energy entropy from a vibration signal. The cloud server is configured to generate a warning instruction based on the environmental information processed by the edge processing unit. The warning execution unit is configured to perform warning and alarming actions based on the warning instruction generated by the cloud server. The communication unit is configured to enable data and information transmission among the data acquisition unit, the edge processing unit, the cloud server and the warning execution unit.

In this embodiment, each of the at least one multimodal sensing device includes an acoustic print sensor array, a low-frequency high-sensitivity microphone, an electromagnetic interference-resistant fiber-optic acoustic sensor, a vibration sensor, an infrared thermal imaging module and a positioning module. The positioning module adopts dual-mode positioning based on BeiDou Navigation Satellite System/Global Positioning System (GPS).

The data acquisition unit is internally equipped with an adaptive gain circuit and an anti-aliasing filter. The adaptive gain circuit is configured to dynamically adjust signal amplitude and improve a signal-to-noise ratio, thereby enhancing the adaptability of the data acquisition unit to varying environments. The anti-aliasing filter is configured to suppress high-frequency noise by removing signal components exceeding the Nyquist frequency (i.e., half the sampling rate) to prevent aliasing distortion while ensuring sampling accuracy through faithful reconstruction of original analog signals from analog-to-digital conversion (ADC) outputs.

The adaptive filtering module includes a 26-dimensional Mel filter bank. By means of the 26-dimensional Mel filter bank, memory access and data processing time are reduced, thereby meeting the low-latency requirements of real-time audio stream. Moreover, the 26-dimensional Mel energy features can be further compressed into 12 to 13 dimensions through subsequent processing, such as discrete cosine transformation (DCT) to obtain Mel Frequency Cepstral Coefficient (MFCC), thereby reducing model input complexity while retaining sufficient acoustic discriminability. In addition, more spectral energy in the high-frequency region is merged, which naturally smooths high-frequency noise such as white noise and electromagnetic interference, thus enhancing the stability of extracted features in a noisy environment.

By means of the data acquisition unit, acoustic print information and the device coordinate around the plurality of transmission towers are collected in real time, and then rapidly analyzed and evaluated in coordination by the edge processing unit and the cloud server. When it is recognized that a large construction vehicle is operating and staying within a safety distance of the plurality of transmission towers, the warning execution unit immediately performs the warning and alarming actions. Then, relevant information is fed back to the data acquisition unit, forming a closed loop to ensure real-time monitoring of the surroundings of the transmission towers, thereby enabling timely warning and alarming of nearby vehicles.

In an embodiment, the data acquisition unit is further provided with a solar-supercapacitor power supply system, and the solar-supercapacitor power supply system is configured to ensure stable and long-term operation of the at least one multimodal sensing device.

In an embodiment, the system provided herein further includes a feedback reinforcement module, and the feedback reinforcement module is configured to enable intelligent active defense of the transmission towers.

In this embodiment, the feedback reinforcement module is configured to analyze historical response effectiveness using a causal forest algorithm, dynamically adjust the alarm threshold and response strategy, and establish a minute-level closed-loop control cycle of risk identification, precise mitigation, and model evolution, thereby achieving intelligent active defense against external damage risks in the transmission corridor.

Figure 4:
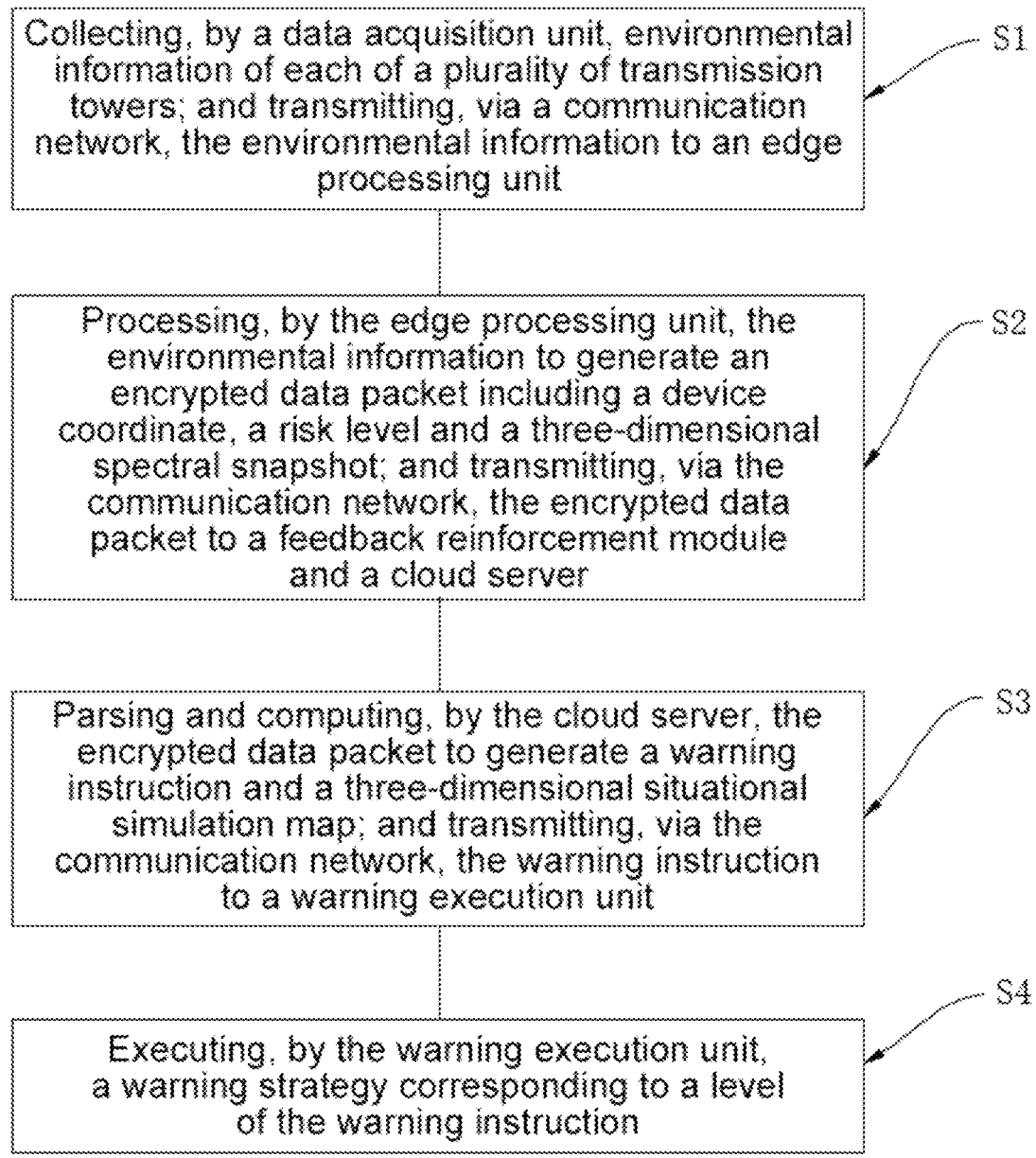
FIG. 4 is flowchart of a method for breakage early warning of a high-voltage transmission line according to an embodiment of the present disclosure.

As shown in FIG. 4, an embodiment of the present disclosure provides a method implemented by the above system, including the following steps.

(S1) Environmental information of each of a plurality of transmission towers is collected by the data acquisition unit and transmitted to the edge processing unit via a communication network.

(S2) The environmental information is processed by the edge processing unit to generate an encrypted data packet including a coordinate of a detection device provided at a base of each of plurality of transmission towers, a risk level and a three-dimensional spectral snapshot. Then, the encrypted data packet is transmitted to the feedback reinforcement module and the cloud server via the communication network.

(S3) The encrypted data packet is parsed and computed by the cloud server to generate a warning instruction and a three-dimensional situational simulation map. The warning instruction is transmitted to the warning execution unit via the communication network.

(S4) A warning strategy corresponding to a level of the warning instruction is executed by the warning execution unit.

In this embodiment, the environmental information includes acoustic print information, a location coordinate of a construction vehicle operating under the plurality of transmission towers and meteorological monitoring data.

The communication network integrates LoRa and 5G networks for hybrid communication.

By means of the data acquisition unit, acoustic print information and the device coordinate around the plurality of transmission towers are collected in real time, and then rapidly analyzed and evaluated in coordination by the edge processing unit and the cloud server. When it is determined that a large construction vehicle is operating and dwelling within a safety distance of the plurality of transmission towers, the warning execution unit immediately performs the warning and alarming actions. Then, relevant information is fed back to the data acquisition unit, forming a closed loop to ensure real-time monitoring of the surroundings of the transmission towers, thereby enabling timely warning and alarming of nearby vehicles.

In an embodiment, the step S1 further includes the following steps.

The at least one multimodal sensing device is deployed at a base of the plurality of transmission towers to continuously collect low-frequency acoustic print information from construction vehicle engines and hydraulic equipment in real time.

The coordinate of the high-voltage transmission tower is obtained through BeiDou Navigation Satellite System (BDS) and Global Positioning System (GPS) dual-mode positioning.

In this embodiment, each of the at least one multimodal sensing device is primarily equipped with the low-frequency high-sensitivity microphone and the electromagnetic interference-resistant fiber-optic acoustic sensor, and is further integrated with the vibration sensor and the infrared thermal imaging module.

Positioning accuracy is enhanced by BDS/GPS dual-mode positioning.

In an embodiment, the step S2 further includes the following steps.

The acoustic print information is processed by the adaptive filtering module to eliminate the wind noise interference and compensate for a frequency response deviation of the at least one multimodal sensing device. The MFCC feature of the acoustic print information and the low-frequency spectral energy entropy generated by the vibration signal of the construction vehicle operating under the plurality of transmission towers are extracted by the processing chip and compared to form a multimodal feature.

The multimodal feature is input into an artificial intelligence (AI) model to complete acoustic-vibration feature matching within 20 ms and output a confidence score.

For an abnormal event with the confidence score exceeding a predefined threshold, a Kalman filter-based baseline correction algorithm is triggered to eliminate an effect of temperature drift. A Key feature vector is compressed using Lempel-Ziv 4 (LZ4) and embedded with a spatiotemporal tag to generate the encrypted data packet including the device coordinate, a refined feature flow, a BeiDou positioning coordinate, the meteorological monitoring data and the three-dimensional spectral snapshot.

In this embodiment, the adaptive filtering module is configured to process the acoustic fingerprint information by means of wavelet packet decomposition and an improved short-time Fourier transform (STFT) algorithm.

The processing chip adopts an NVIDIA® Jetson Orin™ chip. Furthermore, the extraction of the MFCC feature from the acoustic fingerprint information and the low-frequency spectral energy entropy from the vibration signal is accelerated by a Field-Programmable Gate Array (FPGA).

The FPGA is a reconfigurable chip capable of implementing customized hardware circuits through programmable configuration. Unlike an application-specific integrated circuit (ASIC) with fixed functionality, the FPGA allows logic functions to be flexibly defined as needed, and is widely used in hardware acceleration, prototyping, and real-time signal processing.

The AI model is a pruned-optimized ResNet-18 neural network. Through transfer learning, a feature library of 20 categories of construction vehicle acoustic fingerprints is injected into the AI model. The feature library includes typical noise templates such as excavator hydraulic pumps and crane motors, as well as low-frequency noise generated by engine roars and the operation of large construction machinery.

LZ4 is a high-performance lossless data compression algorithm that focuses on extremely fast compression and decompression speed. It is particularly suitable for latency-sensitive scenarios such as real-time data transmission and memory/disk compression. It is designed to strike a balance between speed and the compression ratio, typically trading lower the compression ratio for significant speed advantage.

In an embodiment, the step S3 further includes the following steps.

The encrypted data packet uploaded by the edge processing unit is accessed in real time via a multi-source data fusion engine based on a Kubernetes-orchestrated distributed computing cluster. A three-dimensional spatial topology relationship of the plurality of transmission towers is modeled by using a Graph Spatio-Temporal Attention Network (GSTAN). Millimeter-level three-dimensional positioning of construction machinery is performed through an improved Iterative Closest Point (ICP) point cloud registration algorithm.

A multi-dimensional safety distance assessment is initiated. When a construction vehicle is sensed to enter an electronic fence warning zone, a multimodal dwell-time monitoring mechanism is immediately triggered.

In this embodiment, the GSTAN is a deep learning model that integrates a Graph Neural Network (GNN) with a spatio-temporal attention mechanism, and is primarily used for processing spatio-temporally dependent data, such as traffic flow prediction, human behavior prediction, and dynamic recommendation systems.

The multi-dimensional safety distance is assessed based on an equipment motion trajectory prediction model, which dynamically computes the minimum spatial clearances between mechanical boom extensions, lifting heights, and power lines. The motion trajectory prediction model is composed of a Long Short-Term Memory (LSTM) and a Kalman filter. The LSTM is a specialized type of Recurrent Neural Network (RNN) designed specifically to address the vanishing and exploding gradient problem commonly encountered in traditional RNN when processing long sequential data. By introducing a gating mechanism, the LSTM can effectively capture long-term dependencies and is widely used in time-series data modeling, such as natural language processing, speech recognition, and stock prediction.

In an embodiment, the step of triggering the multimodal dwell-time monitoring mechanism includes the following steps.

The MFCC feature from the acoustic print information and thermal imaging data are parsed in real time through Spark Streaming. If a duration when the construction vehicle stays in a hazardous zone exceeds a predefined threshold, a federated learning-optimized risk assessment model is invoked. A multi-factor weighted decision-making is performed based on a historical health status of the construction vehicle, ambient temperature and humidity, and a real-time spectral feature to generate the warning instruction and the three-dimensional situational simulation map.

In this embodiment, the MFCC feature from the acoustic print information are characterized by the duration of 2.4 kHz characteristic frequency bands from hydraulic pumps, while the thermal imaging data reflect the heat source diffusion trends of engines. A threshold of 15-20 s is preset for continuous equipment operation within the hazardous zone. The risk assessment model is integrated with Extreme Gradient Boosting (XGBoost) anomaly scoring and Transformer with extra Long-term dependency (Transformer-XL)-based time series prediction. The warning instruction includes a level-1, a-level-2, and a level-3 warning instructions, each corresponding to a predefined warning strategy.

In an embodiment, the step S4 further includes the following steps.

When the warning instruction is sent by the cloud server, if it is the level-1 warning instruction, a local acoustic-visual alarm device of the plurality of transmission towers is immediately activated. Simultaneously, a BeiDou positioning module on each of the plurality of transmission towers is triggered through the communication network to transmit a voice alert to an operation cabin of the construction vehicle within a 300-meter radius of each of the plurality of transmission towers.

If the level-2 warning instruction is issued, a remote collaborative response is initiated. An electronic work order including a three-dimensional positioning coordinate, a risk heat map and a response plan is automatically dispatched to inspection personnel via the communication network. At the same time, an unmanned aerial vehicle (UAV) formation is dispatched to a construction vehicle operation site to perform aerial evidence collection using an onboard infrared thermal imager and to send a remote alarm through a loudspeaker system.

If the level-3 warning instruction is issued, a coordinated interaction is established with a power grid control system. A line voltage reduction command is transmitted to a dispatch master station via an OPC Unified Architecture (OPCUA) protocol. A risk segment is marked on a digital twin platform. Data is transmitted in real time by a UAV to a control unit of the power grid control system. A feature extraction threshold of the AI model is optimized via a federated learning mechanism. A warning event is entirely recorded using a blockchain technology.

In this embodiment, the acoustic-visual alarm device includes a 120 dB directional sound wave emitter and a strobe warning light. The voice alert is provided in both Chinese and English, and a Recurrent Neural Network Transducer (RNN-T) speech synthesis technology is employed.

The three-dimensional positioning coordinate, the risk heat map, and the response plan can be received by inspection personnel through communication devices and Augmented Reality (AR) glasses (Microsoft HoloLens 2). The UAV model is Matrice 300 RTK (manufactured by DJI Technology Co., Ltd.). The model of the onboard infrared thermal imager is Boson (manufactured by FLIR Systems, Inc.). The loudspeaker system is a horn.

The data transmitted by the UAV is 4K imagery, and the blockchain technology used is Hyperledger Fabric.

Described above are merely preferred embodiments of the present disclosure, and are not intended to limit the scope of the present disclosure. It should be understood that various modifications, changes and replacements made by those skilled in the art without departing from the spirit of the disclosure shall fall within the scope of the present disclosure defined by the appended claims.

What is claimed is:

1. A method for breakage early warning of a transmission line based on acoustic prints, comprising:
   collecting, by a data acquisition unit, environmental information of each of a plurality of transmission towers; and transmitting, via a communication network, the environmental information to an edge processing unit;
   processing, by the edge processing unit, the environmental information to generate an encrypted data packet comprising a coordinate of a detection device provided at a base of each of the plurality of transmission towers, a risk level and a three-dimensional spectral snapshot; and transmitting, via the communication network, the encrypted data packet to a feedback reinforcement module and a cloud server;
   parsing and computing, by the cloud server, the encrypted data packet to generate a warning instruction and a three-dimensional situation simulation map; and transmitting, via the communication network, the warning instruction to a warning execution unit; and
   executing, by the warning execution unit, a warning strategy corresponding to a level of the warning instruction.

2. The method of claim 1, wherein the step of collecting the environmental information of the transmission tower by the data acquisition unit further comprises:
   deploying at least one multimodal sensing device at a base of each of the plurality of transmission towers to collect acoustic print information, a location coordinate of a construction vehicle operating under the plurality of transmission towers and meteorological monitoring data in real time.

3. The method of claim 2, wherein the step of processing, by the edge processing unit, the environmental information further comprises:
   processing, by an adaptive filtering module within the edge processing unit, the acoustic print information to eliminate wind noise interference and compensate for a frequency response deviation of the at least one multimodal sensing device;

extracting, by a processing chip within the edge processing unit, a mel-frequency cepstral coefficient (MFCC) feature from the acoustic print information and low-frequency spectral energy entropy generated by a vibration signal of the construction vehicle operating under the plurality of transmission towers followed by comparison to form a multimodal feature;

inputting the multimodal feature into an artificial intelligence (AI) model to complete acoustic-vibration feature matching within 20 ms and output a confidence score;

for an abnormal event with the confidence score exceeding a predefined threshold, triggering a Kalman filter-based baseline correction algorithm to eliminate an effect of temperature drift; and compressing a key feature vector using Lempel-Ziv 4 (LZ4) followed by embedding with a spatiotemporal tag to generate the encrypted data packet comprising the device coordinate, a refined feature flow, a BeiDou positioning coordinate, the meteorological monitoring data, and the three-dimensional spectral snapshot.

4. The method of claim 3, wherein the step of parsing and computing, by the cloud server, the encrypted data packet further comprises:

accessing, in real time, the encrypted data packet uploaded by the edge processing unit through a multi-source data fusion engine based on a Kubernetes-orchestrated distributed computing cluster;

modeling a three-dimensional spatial topology relationship of the plurality of transmission towers by using a Graph Spatio-Temporal Attention Network (GSTAN), and performing millimeter-level three-dimensional positioning of construction machinery through an improved Iterative Closest Point (ICP) point cloud registration algorithm; and initiating a multi-dimensional safety distance assessment, and triggering a multimodal dwell-time monitoring mechanism in response to a case that the construction vehicle is sensed to enter an electronic fence warning zone.

5. The method of claim 4, wherein the step of triggering the multimodal dwell-time monitoring mechanism comprises:

parsing, in real time, the MFCC feature from the acoustic print information and thermal imaging data through Spark Streaming; and if a duration when the construction vehicle stays in a hazardous zone exceeds a predefined threshold, invoking a federated learning-optimized risk assessment model; and performing multi-factor weighted decision-making based on a historical health status of the construction vehicle operating under the plurality of transmission towers, ambient temperature and humidity, and a real-time spectral feature to generate the warning instruction and the three-dimensional situation simulation map.

6. The method of claim 5, wherein the step of executing, by the warning execution unit, the warning strategy corresponding to the level of the warning instruction comprises:

if the warning instruction is a level-1 warning instruction, activating a local acoustic-visual alarm device of the plurality of transmission towers; and triggering, via the communication network, a BeiDou positioning module on each of the plurality of transmission towers to transmit a voice alert to an operation cabin of the construction vehicle located within a 300-meter radius of each of the plurality of transmission towers.

7. The method of claim 5, wherein the step of executing, by the warning execution unit, the warning strategy corresponding to the level of the warning instruction comprises:

if the warning instruction is a level-2 warning instruction, initiating a remote collaborative response, and automatically dispatching, via the communication network, an electronic work order to inspection personnel, wherein the electronic work order comprises a three-dimensional positioning coordinate, a risk heat map and a response plan; and dispatching an unmanned aerial vehicle (UAV) formation to a construction vehicle operation site to perform aerial evidence collection using an onboard infrared thermal imager and to send a remote alarm through a loudspeaker system.

8. The method of claim 5, wherein the step of executing, by the warning execution unit, the warning strategy corresponding to the level of the warning instruction comprises:

if the warning instruction is a level-3 warning instruction, establishing a coordinated interaction with a power grid control system, and transmitting a line voltage reduction command to a dispatch master station via an OPC Unified Architecture (OPCUA) protocol;

marking a risk segment on a digital twin platform;

transmitting data by a UAV to a control unit of the power grid control system in real time;

optimizing a feature extraction threshold of the AI model via a federated learning mechanism; and entirely recording a warning event using a blockchain technology.

9. A system for implementing the method according to claim 3, comprising:

the data acquisition unit;
the edge processing unit;
the cloud server;
the warning execution unit; and
a communication unit;

wherein the data acquisition unit comprises the at least one multimodal sensing device; and the data acquisition unit is configured to collect the environmental information of the plurality of transmission towers in real time through the at least one multimodal sensing device;

the edge processing unit comprises the adaptive filtering module and the processing chip; the adaptive filtering module is configured to eliminate the wind noise interference in the environmental information collected by the at least one multimodal sensing device and compensate for the frequency response deviation; and the processing chip is configured to extract the MFCC feature from the acoustic print information and the low-frequency spectral energy entropy from the vibration signal;

the cloud server is configured to generate the warning instruction based on the environmental information processed by the edge processing unit;

the warning execution unit is configured to perform warning and alarming actions based on the warning instruction generated by the cloud server; and the communication unit is configured to enable data and information transmission among the data acquisition unit, the edge processing unit, the cloud server and the warning execution unit.

10. The system of claim 9, wherein each of the at least one multimodal sensing device comprises a acoustic print sensor array, a fiber-optic acoustic sensor, a vibration sensor, an infrared thermal imaging module and a positioning module; and the data acquisition unit is internally equipped with an adaptive gain circuit and an anti-aliasing filter.

\* \* \* \* \*